(12) United States Patent
Zhu

(10) Patent No.: US 11,393,881 B2
(45) Date of Patent: Jul. 19, 2022

(54) DISPLAY DEVICE AND MANUFACTURING METHOD THEREOF

(71) Applicant: WUHAN CHINA STAR OPTOELECTRONICS SEMICONDUCTOR DISPLAY TECHNOLOGY CO., LTD., Hubei (CN)

(72) Inventor: Zhengfeng Zhu, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 218 days.

(21) Appl. No.: 16/958,787

(22) PCT Filed: May 9, 2020

(86) PCT No.: PCT/CN2020/089336
§ 371 (c)(1),
(2) Date: Jun. 29, 2020

(87) PCT Pub. No.: WO2021/189608
PCT Pub. Date: Sep. 30, 2021

(65) Prior Publication Data
US 2021/0305321 A1 Sep. 30, 2021

(51) Int. Cl.
*H01L 27/32* (2006.01)
(52) U.S. Cl.
CPC ........ *H01L 27/322* (2013.01); *H01L 27/3244* (2013.01)

(58) Field of Classification Search
CPC .............. H01L 27/322; H01L 27/3244; H01L 27/3246; H01L 51/5284
See application file for complete search history.

(56) References Cited

U.S. PATENT DOCUMENTS

| | | | |
|---|---|---|---|
| 7,474,275 B2 | 1/2009 | Sundahl | |
| 8,173,485 B2 | 5/2012 | Song et al. | |
| 9,083,003 B2 | 7/2015 | Lee | |
| 11,281,044 B2* | 3/2022 | Chen | H01L 27/322 |
| 11,282,905 B2* | 3/2022 | Park | H01L 51/5228 |
| 2019/0006429 A1* | 1/2019 | Ota | H01L 51/5284 |
| 2019/0189728 A1* | 6/2019 | Lee | H01L 51/56 |
| 2019/0386253 A1 | 12/2019 | Li et al. | |

(Continued)

FOREIGN PATENT DOCUMENTS

| | | |
|---|---|---|
| CN | 1321254 A | 11/2001 |
| CN | 104090419 A | 10/2014 |

(Continued)

*Primary Examiner* — Douglas W Owens
(74) *Attorney, Agent, or Firm* — Mark M. Friedman

(57) ABSTRACT

A display device and a manufacturing method thereof are provided. The method includes: forming a device board; forming a first light-shielding layer in the first region and on the device board, wherein an inclination angle between a first light-shielding unit in the first light-shielding layer and the device board is less than 90 degrees; forming a second light-shielding layer on the first light-shielding layer, wherein an inclination angle between a second light-shielding unit in the second light-shielding layer and the device board is less than 90 degrees; forming a color resist layer in the second region and on the device board; and forming a passivation layer.

18 Claims, 3 Drawing Sheets

(56) References Cited

U.S. PATENT DOCUMENTS

2021/0011342 A1 1/2021 Chen et al.
2021/0013241 A1 1/2021 Lin et al.

FOREIGN PATENT DOCUMENTS

| CN | 104241329 A | 12/2014 |
| CN | 106783936 A | 5/2017 |
| CN | 107403820 A | 11/2017 |
| CN | 107731873 A | 2/2018 |
| CN | 110211997 A | 9/2019 |
| CN | 110534551 A | 12/2019 |

* cited by examiner

DISPLAY DEVICE AND MANUFACTURING METHOD THEREOF

BACKGROUND OF DISCLOSURE

1. Field of Disclosure

The present disclosure relates to the field of display technology, and more particularly, to a display device and a manufacturing method thereof.

2. Description of Related Art

The display technology includes a liquid crystal display (LCD) display technology and an organic light emitting diode (OLED) display technology.

In the OLED display technology, a polarizer-less technology uses a color filter (CF) instead of a polarizer (POL), not only reducing a thickness of a functional layer from 100 to 5 micrometers and below but also increasing the extraction efficiency from 42% to 60%. The CF-based POL-less technology is regarded as a key technology to realize the development of dynamic bendable products while a CF substrate is used in the LCD display technology to filter light emitted from a backlit source.

Currently, CF preparation processes include using a black matrix (BM) as a bank layer. However, in the course of forming color resist blocks, a color resist material for forming the color resist blocks is prone to stick to the surface of the BM, causing a low accuracy of a color resist layer in the CF preparation processes.

Therefore, it is necessary to provide a new technical solution to solve the above technical problems.

SUMMARY

A technical problem is that the present disclosure provides a display device and a manufacturing method thereof, which can improve accuracy of a color resist layer in processes of manufacturing a color filter of the display device.

A technical solution is that the present disclosure provides a method of manufacturing a display device, the method including:

(A) forming a device board including a first region and a second region arranged apart from each other;

(B) forming a first light-shielding layer in the first region and on the device board, wherein an inclination angle between a first light-shielding unit in the first light-shielding layer and the device board is less than 90 degrees;

(C) forming a second light-shielding layer on the first light-shielding layer, wherein an inclination angle between a second light-shielding unit in the second light-shielding layer and the device board is less than 90 degrees, and an orthogonal projection of the second light-shielding unit over the device board covers at least one part of an orthogonal projection of the first light-shielding unit over the device board;

(D) forming a color resist layer in the second region and on the device board; and (E) forming a passivation layer covering the second light-shielding layer and the color resist layer.

In the method of manufacturing the display device provided in the present disclosure, the inclination angle between the second light-shielding unit in the second light-shielding layer and the device board is greater than or equal to the inclination angle between the first light-shielding unit in the first light-shielding layer and the device board.

In the method of manufacturing the display device provided in the present disclosure, the step (C) includes:

(C1) manufacturing the second light-shielding layer using a photoresist material, wherein the photoresist material includes a fluorine-containing compound.

In the method of manufacturing the display device provided in the present disclosure, the step (C1) includes:

(C11) forming a light-shielding material layer by coating the first light-shielding layer with the photoresist material; and (C12) heating the device board on which the light-shielding material layer is formed, so that the light-shielding material layer is formed as the second light-shielding layer.

In the method of manufacturing the display device provided in the present disclosure, a thickness of the first light-shielding layer is greater than or equal to that of the second light-shielding layer.

In the method of manufacturing the display device provided in the present disclosure, the fluorine-containing compound includes fluororesin.

In the method of manufacturing the display device provided in the present disclosure, the fluororesin includes one of polytetrafluoroethylene and polychlorotrifluoroethylene, or a combination thereof.

In the method of manufacturing the display device provided in the present disclosure, the device board in the step (A) includes a thin-film transistor array substrate.

In the method of manufacturing the display device provided in the present disclosure, the device board in the step (A) includes a glass substrate or a flexible underlaying substrate.

The present disclosure further provides a display device, including:

a device board including a thin-film transistor array substrate, a plurality of sub-pixel units disposed on the thin-film transistor array substrate, and an encapsulation layer disposed on the plurality of sub-pixel units, wherein the encapsulation layer includes a first region and a second region;

a first light-shielding layer disposed in the first region of the encapsulation layer, wherein an inclination angle between a first light-shielding unit in the first light-shielding layer and the encapsulation layer is less than 90 degrees;

a second light-shielding layer disposed on the first light-shielding layer, wherein an inclination angle between a second light-shielding unit in the second light-shielding layer and the encapsulation layer is less than 90 degrees, and an orthogonal projection of the second light-shielding unit over the encapsulation layer covers at least one part of an orthogonal projection of the first light-shielding unit over the encapsulation layer;

a color resist layer disposed in the second region of the encapsulation layer; and a passivation layer covering the second light-shielding layer and the color resist layer.

In the display device provided in the present disclosure, the inclination angle between the second light-shielding unit in the second light-shielding layer and the encapsulation layer is greater than or equal to the inclination angle between the first light-shielding unit in the first light-shielding layer and the encapsulation layer.

In the display device provided in the present disclosure, a thickness of the first light-shielding layer is greater than or equal to that of the second light-shielding layer.

In the display device provided in the present disclosure, a material of the second light-shielding layer includes a fluorine-containing compound.

In the display device provided in the present disclosure, the fluorine-containing compound includes fluororesin.

In the display device provided in the present disclosure, the fluororesin includes one of polytetrafluoroethylene and polychlorotrifluoroethylene, or a combination thereof.

In the display device provided in the present disclosure, a plurality of color resist blocks in the color resist layer respectively correspond to the plurality of sub-pixel units in the device board.

In the display device provided in the present disclosure, a material of the color resist layer includes one of a fluorescent material, a quantum dot material or a color filter material, or any combination thereof.

In the display device provided in the present disclosure, a material of the passivation layer includes one of silicon oxide, silicon nitride, alumina, phenol-based resin, polypanpylene-based resin, polyimide-based resin, and acrylic resin, or any combination thereof.

The beneficial effect of the present disclosure is that, compared with conventional technologies, in a display device and a manufacturing method thereof in an embodiment of the present disclosure, a second light-shielding layer is prepared on a first light-shielding layer, and the first light-shielding layer and the second light-shielding layer are formed through exposure with a predetermined mask, wherein an inclination angle between a first light-shielding unit in the first light-shielding layer and a device board is less than 90 degrees, and an inclination angle between a second light-shielding unit in the second light-shielding layer and the device board is less than 90 degrees. Because an inclination angle θ1 of the first light-shielding layer and an inclination angle θ2 of the second light-shielding layer are less than 90 degrees, a color resist material can fall in a second region of the device board through the inclination angle in the course of forming a color resist layer. This improves accuracy of the color resist layer of the display device in color filter preparation processes.

Also, due to a difficulty in developing hydrophobic light-shielding materials, two laminated light-shielding layers are prepared using different light-shielding materials in an embodiment of the present disclosure. This can reduce manufacturing costs without considering a hydrophobic performance of the first light-shielding layer.

DETAILED DESCRIPTION OF EMBODIMENTS

Figure 1:
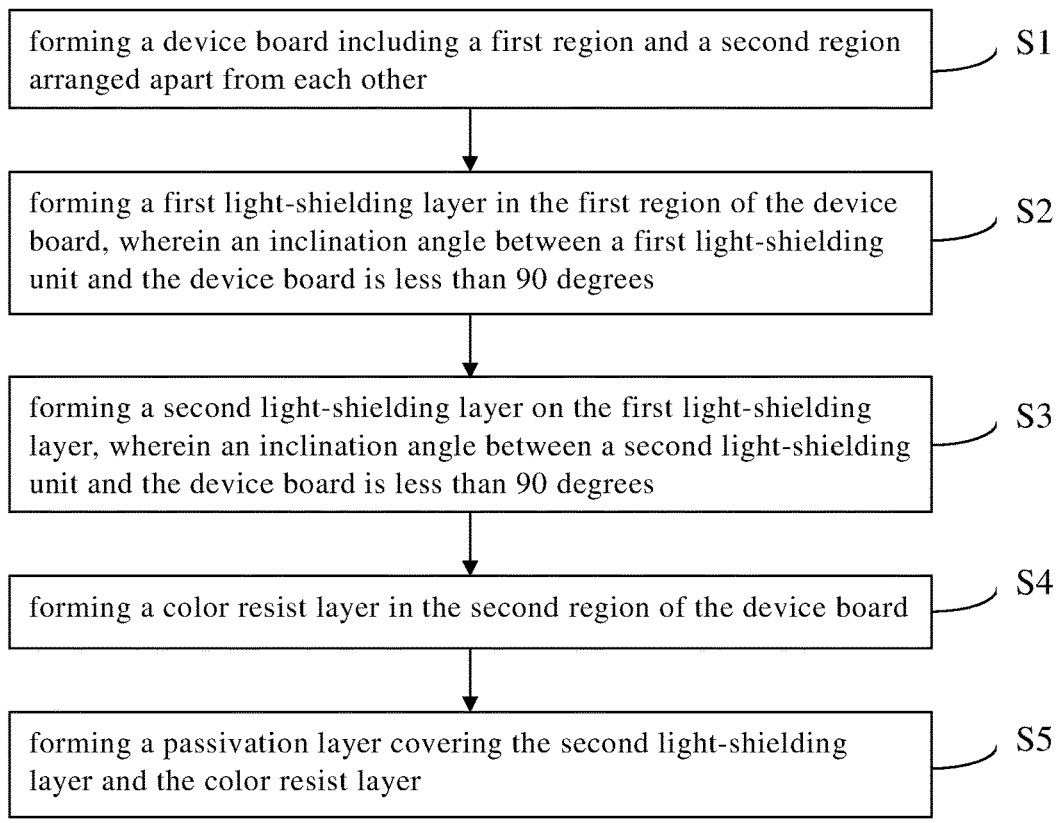
FIG. 1 illustrates a flowchart depicting a method of manufacturing a display device according to one embodiment of the present disclosure.

In order to more clearly explain objects, technical solutions, and advantages of the present disclosure, it is further described in detail with accompanying drawings below. Referring to the drawings, same component symbols represent same components. The following descriptions are specific embodiments of the present disclosure based on the examples, and should not be construed as a limitation to other specific embodiments of the present disclosure that are not described herein in detail. The term "embodiment" used in the description means an example, an illustration, or an instance. In addition, a definite article "one" used in the description and the appended claims can be generally explained as "one or more" unless being designated additionally or unless being clearly confirmed as singular from its context.

It needs to be stated that although a particular number of particular steps are shown in a particular order in an embodiment of the present disclosure, other numbers of steps, other steps, other sub-steps, other combinations of steps, and other orders of the steps may be possible. In other words, despite the particular example representation shown in some figure, the intention of this disclosure is to encompass any combinations and orders of steps and/or sub-steps that are practicable to achieve the functions of the present disclosure.

It needs to be stated that in an embodiment of the present disclosure, a method of manufacturing a display device includes a method of manufacturing an organic light emitting diode display device and a method of manufacturing a color filter substrate in a liquid crystal display device. The display device includes an organic light emitting diode display device and a liquid crystal display device.

As shown in FIG. 1, a method of manufacturing a display device is provided in an embodiment of the present disclosure. The method includes:

Step S1: forming a device board including a first region and a second region arranged apart from each other.

Figure 2:
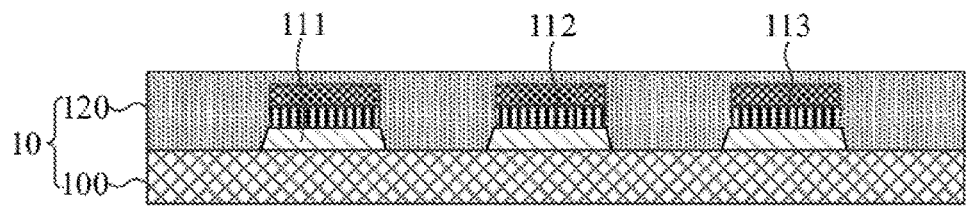
FIGS. 2-6 are schematic diagrams depicting a method of manufacturing a display device according to one embodiment of the present disclosure.

As shown in FIG. 2, the device board 10 includes a thin-film transistor array substrate 100, sub-pixel units, and an encapsulation layer 120, wherein the thin-film transistor array substrate 100 includes a base, a buffer layer, a semiconductor layer, an insulation layer, a gate electrode, a source electrode, a drain electrode, a planarization layer, and a pixel definition layer. Each sub-pixel unit (not shown) includes a cathode 111, an organic light-emitting layer 112, and an anode 113.

It is selectable that the device board includes an underlay. The underlay includes a glass substrate and a flexible underlaying substrate. At this time, if the device board 10 is a glass substrate or a flexible underlaying substrate, a color filter substrate can be formed in follow-up preparation processes.

Step S2: forming a first light-shielding layer in the first region and on the device board, wherein an inclination angle between a first light-shielding unit in the first light-shielding layer and the device board is less than 90 degrees; and wherein the inclination angle between the first light-shielding unit in the first light-shielding layer and the device board refers to an angle between the first light-shielding unit and a plane where the device board is located.

Step S3: forming a second light-shielding layer on the first light-shielding layer, wherein an inclination angle between a second light-shielding unit in the second light-shielding layer and the device board is less than 90 degrees, and an orthogonal projection of the second light-shielding unit over the device board covers at least one part of an orthogonal projection of the first light-shielding unit over the device board; and wherein the inclination angle between the second light-shielding unit in the second light-shielding layer and the device board refers to an angle between the second light-shielding unit and a plane where the device board is located.

Step S4: forming a color resist layer in the second region and on the device board;

wherein a material of the color resist layer includes a fluorescent material, a quantum dot material, and a color filter material, etc.

Step S5: forming a passivation layer covering the second light-shielding layer and the color resist layer.

Figure 7:
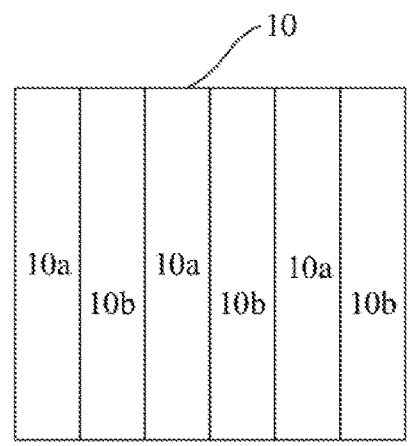
FIG. 7 is a top view of a device board according to one embodiment of the present disclosure.

Specifically, please continue to refer to FIG. 2, in a method of manufacturing an organic light emitting diode display device, step S1 includes: forming the thin-film transistor array substrate 100 by sequentially forming the buffer layer, the semiconductor layer, the insulation layer, the gate electrode, the source electrode, the drain electrode, the planarization layer, and the pixel definition layer on the base; forming the sub-pixel units by sequentially forming the cathode 111, the organic light-emitting layer 112, and the anode 113; and then forming the encapsulation layer 120. As shown in FIG. 7, the device board 10 includes a first region 10a and a second region 10b. It needs to be stated that the device board 10 can be divided by other forms further.

Figure 3:
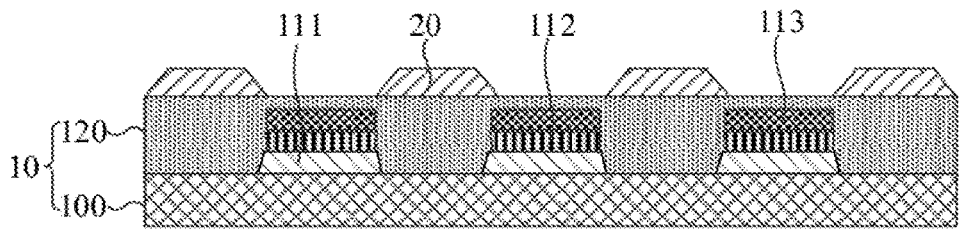

Then, in step S2 as shown in FIG. 3. First, a first light-shielding material layer is deposited on the device board 10 using plasma enhanced chemical vapor deposition (PECVD) technology, magnetron sputtering technology, or heat-vaporing method; then, the first light-shielding layer 20 is patterned by exposing the first light-shielding material layer with a mask. The first light-shielding layer 20 is located in the first region 10a of the device board 10. An inclination angle between a first light-shielding unit in the first light-shielding layer 20 and the device board 10 is less than 90 degrees. A material of the first light-shielding material layer includes metal and a resinous material, for example, stabler metal oxides and metal sulfides, such as CuO, $Fe_2O_3$, $MnO_2$, $Fe_2O_3$, MoS, and CuS, and a black organic resin.

Figure 8:
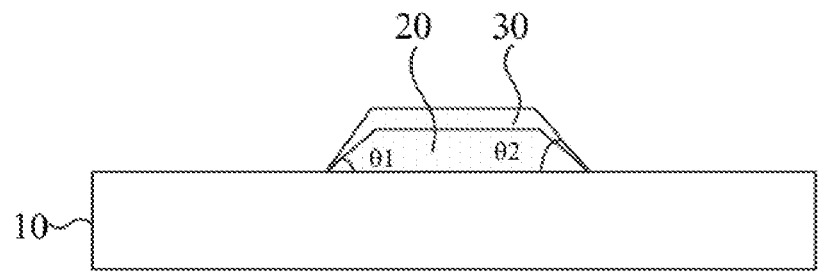
FIGS. 8-9 are schematic diagrams depicting a first light-shielding layer and a second light-shielding layer according to one embodiment of the present disclosure.
Figure 9:
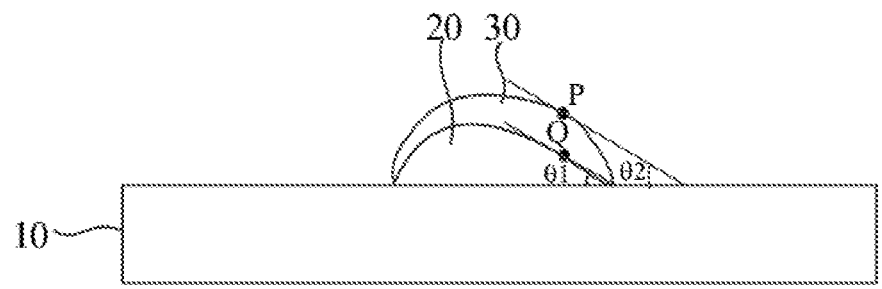

Further, please combine FIG. 8 with FIG. 9, the inclination angle θ2 between the second light-shielding unit in the second light-shielding layer 30 and the device board 10 is greater than or equal to the inclination angle θ1 between the first light-shielding unit in the first light-shielding layer 20 and the device board 10.

It needs to be stated that in an embodiment of the present disclosure, shapes of the first light-shielding layer 20 and the second light-shielding layer 30 can be varied based on practical demands. Specifically, as shown in FIG. 8, when the shapes of the first light-shielding layer 20 and the second light-shielding layer 30 are regular, the inclination angle θ2 between the second light-shielding unit in the second light-shielding layer 30 and the device board 10 is greater than the inclination angle θ1 between the first light-shielding unit in the first light-shielding layer 20 and the device board 10. As shown in FIG. 9, when the shapes of the first light-shielding layer 20 and the second light-shielding layer 30 are irregular, the inclination angle θ1 between the first light-shielding unit in the first light-shielding layer 20 and the device board 10 refers to an angle between a tangent of any point Q except the apex of the first light-shielding unit in the first light-shielding layer 20 and the plane where the device board 10 is located, and the inclination angle θ2 between the second light-shielding unit in the second light-shielding layer 30 and the device board 10 refers to an angle between a tangent of any point P except the apex of the second light-shielding unit in the second light-shielding layer 30 and the plane where the device board 10 is located. At this time, θ2 is greater than or equal to θ1.

Figure 4:
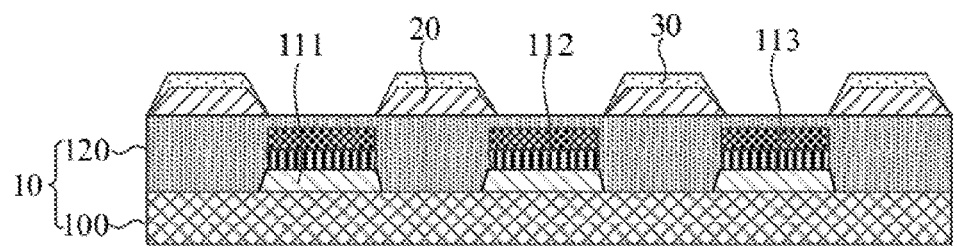

Next, as shown in FIG. 4, step S3 includes step S31: manufacturing the second light-shielding layer 30 using a photoresist material, wherein the photoresist material includes a fluorine-containing compound.

The fluorine-containing compound includes fluororesin such as polytetrafluoroethylene, polychlorotrifluoroethylene, etc.

Further, step S31 includes:

Step S311: forming a light-shielding material layer by coating the first light-shielding layer 20 with the photoresist material; and Step S312: heating the device board 10 on which the light-shielding material layer is formed, so that the light-shielding material layer is formed as the second light-shielding layer 30.

Coating methods of photoresist material include ink-jet printing, PECVD, physical vapor deposition, etc.

Specifically, a surface of the device board 10 is coated with the photoresist material using spraying, spin coating, or brushing. The device board 10 where the light-shielding material layer is formed is heated with a heating temperature between 50 and 180 degrees. It needs to be stated that in an embodiment of the present disclosure, the first light-shielding layer 20 can be coated with the photoresist material many times, then the light-shielding material layer is prepared by heating, and lastly, the second light-shielding layer 30 is formed by exposing the light-shielding material layer with a mask. A film thickness of the second light-shielding layer 30 made by the method is controllable, and power consumption is low.

It is optional that in an embodiment of the present disclosure, the photoresist material can be deposited on the first light-shielding layer 20 through PECVD, physical vapor deposition, etc., and then the second light-shielding layer 30 is formed by exposing the photoresist material with a mask.

Please continue to refer to FIG. 4 further, in an embodiment of the present disclosure, a thickness of the first light-shielding layer 20 is greater than or equal to that of the second light-shielding layer 30.

It needs to be stated that in an embodiment of the present disclosure, the first light-shielding layer 20 includes N first light-shielding units, and the second light-shielding layer 30 includes N second light-shielding units, wherein N is an integer greater than zero.

Figure 5:
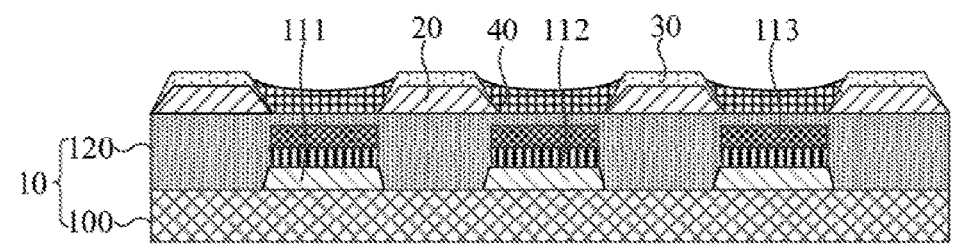

In step S4 as shown in FIG. 5, the second region 10b of the device board 10 is coated with a color resist material using spraying, spin coating, or brushing and is cured to form a color resist layer. A material of the color resist layer includes a fluorescent material, a quantum dot material, and a color filter material.

Figure 6:
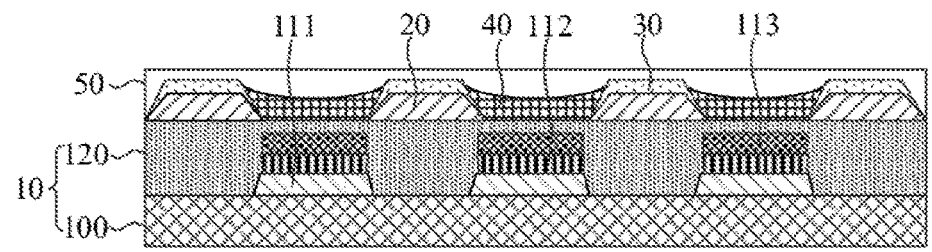

In step S5 as shown in FIG. 6, a passivation layer 50 is manufactured using chemical vapor deposition, PECVD, atomic layer deposition (ALD) technology, or sputtering. A material of the passivation layer 50 includes at least one of inorganic film materials such as silicon oxide, silicon nitride, or alumina, and flexible resin materials such as phenol-based resin, polypanpylene-based resin, polyimide-based resin, and acrylic resin.

In an embodiment of the present disclosure, the second light-shielding layer 30 is prepared on the first light-shielding layer 20, and the first light-shielding layer and the second light-shielding layer are formed through exposure with a predetermined mask, wherein an inclination angle θ1 between a first light-shielding unit in the first light-shielding layer 20 and the device board 10 is less than 90 degrees, and an inclination angle θ2 between a second light-shielding unit in the second light-shielding layer 30 and the device board 10 is less than 90 degrees. Because the inclination angles θ1 and θ2 are less than 90 degrees, a color resist material can fall in a second region of the device board 10 through the inclination angle in the course of forming a color resist layer. This improves accuracy of the color resist layer of the display device in color filter preparation processes.

As shown in the above figures, a display device is further provided in an embodiment of the present disclosure. The display device includes:

a device board 10 including a thin-film transistor array substrate 100, a plurality of sub-pixel units disposed on the thin-film transistor array substrate 100, and an encapsulation layer 120 disposed on the plurality of sub-pixel units, wherein each sub-pixel unit includes a cathode 111, an organic light-emitting layer 112, and an anode 113, and the encapsulation layer 120 includes a first region 10a and a second region 10b;

a first light-shielding layer 20 disposed in the first region 10a of the encapsulation layer 120, wherein an inclination angle between a first light-shielding unit in the first light-shielding layer 20 and the encapsulation layer 120 is less than 90 degrees;

a second light-shielding layer 30 disposed on the first light-shielding layer 20, wherein an inclination angle between a second light-shielding unit in the second light-shielding layer 30 and the encapsulation layer 120 is less than 90 degrees, and an orthogonal projection of the second light-shielding unit over the encapsulation layer 120 covers at least one part of an orthogonal projection of the first light-shielding unit over the encapsulation layer 120;

wherein the inclination angle between the second light-shielding unit in the second light-shielding layer 30 and the encapsulation layer 120 is greater than or equal to the inclination angle between the first light-shielding unit in the first light-shielding layer 20 and the encapsulation layer 120, and a thickness of the first light-shielding layer 20 is greater than or equal to that of the second light-shielding layer 30;

a color resist layer 40 disposed in the second region 10b of the encapsulation layer 120; and a passivation layer 50 covering the second light-shielding layer 30 and the color resist layer 40.

Further, in an embodiment of the present disclosure, a material of the second light-shielding layer 30 includes a fluorine-containing compound, such as polytetrafluoroethylene, polychlorotrifluoroethylene, and other fluororesin.

Further, a plurality of color resist blocks in the color resist layer 40 respectively correspond to the plurality of sub-pixel units in the device board 10.

It needs to be stated that in an embodiment of the present disclosure, shapes of the first light-shielding layer 20 and the second light-shielding layer 30 can be varied based on practical demands. Specifically, as shown in FIG. 8, when the shapes of the first light-shielding layer 20 and the second light-shielding layer 30 are regular, the inclination angle $\theta 2$ between the second light-shielding unit in the second light-shielding layer 30 and the device board 10 is greater than the inclination angle $\theta 1$ between the first light-shielding unit in the first light-shielding layer 20 and the device board 10. As shown in FIG. 9, when the shapes of the first light-shielding layer 20 and the second light-shielding layer 30 are irregular, the inclination angle $\theta 1$ between the first light-shielding unit in the first light-shielding layer 20 and the device board 10 refers to an angle between a tangent of any point Q except the apex of the first light-shielding unit in the first light-shielding layer 20 and the plane where the device board 10 is located, and the inclination angle $\theta 2$ between the second light-shielding unit in the second light-shielding layer 30 and the device board 10 refers to an angle between a tangent of any point P except the apex of the second light-shielding unit in the second light-shielding layer 30 and the plane where the device board 10 is located. At this time, $\theta 2$ is greater than or equal to $\theta 1$.

Compared with conventional technologies, in a display device and a manufacturing method thereof in an embodiment of the present disclosure, a second light-shielding layer is prepared on a first light-shielding layer, and the first light-shielding layer and the second light-shielding layer are formed through exposure with a predetermined mask, wherein an inclination angle between a first light-shielding unit in the first light-shielding layer and a device board is less than 90 degrees, and an inclination angle between a second light-shielding unit in the second light-shielding layer and the device board is less than 90 degrees. Because an inclination angle $\theta 1$ of the first light-shielding layer and an inclination angle $\theta 2$ of the second light-shielding layer are less than 90 degrees, a color resist material can fall in a second region of the device board through the inclination angle. This improves accuracy of a color resist layer of the display device in color filter preparation processes.

Also, due to a difficulty in developing hydrophobic light-shielding materials, two laminated light-shielding layers are prepared using different light-shielding materials in an embodiment of the present disclosure. This can reduce manufacturing costs without considering a hydrophobic performance of the first light-shielding layer.

In conclusion, although the present disclosure has been disclosed with reference to the foregoing preferred embodiments thereof, it is not limited to the foregoing preferred embodiments. For those skilled in the art, a variety of modifications and changes may be made without departing from the scope of the present disclosure which is intended to be defined by the appended claims.

What is claimed is:

1. A method of manufacturing a display device, the method comprising:
   (A) forming a device board comprising a first region and a second region arranged apart from each other;
   (B) forming a first light-shielding layer in the first region and on the device board, wherein an inclination angle between a first light-shielding unit in the first light-shielding layer and the device board is less than 90 degrees;
   (C) forming a second light-shielding layer on the first light-shielding layer, wherein an inclination angle between a second light-shielding unit in the second light-shielding layer and the device board is less than 90 degrees, and an orthogonal projection of the second light-shielding unit over the device board covers at least one part of an orthogonal projection of the first light-shielding unit over the device board;
   (D) forming a color resist layer in the second region and on the device board; and
   (E) forming a passivation layer covering the second light-shielding layer and the color resist layer.

2. The method of claim 1, wherein the inclination angle between the second light-shielding unit in the second light-shielding layer and the device board is greater than or equal to the inclination angle between the first light-shielding unit in the first light-shielding layer and the device board.

3. The method of claim 1, wherein the step (C) comprises:
   (C1) manufacturing the second light-shielding layer using a photoresist material, wherein the photoresist material comprises a fluorine-containing compound.

4. The method of claim 3, wherein the step (C1) comprises:

(C11) forming a light-shielding material layer by coating the first light-shielding layer with the photoresist material; and (C12) heating the device board on which the light-shielding material layer is formed, so that the light-shielding material layer is formed as the second light-shielding layer.

5. The method of claim 4, wherein a thickness of the first light-shielding layer is greater than or equal to that of the second light-shielding layer.

6. The method of claim 3, wherein the fluorine-containing compound comprises fluororesin.

7. The method of claim 6, wherein the fluororesin comprises one of polytetrafluoroethylene and polychlorotrifluoroethylene, or a combination thereof.

8. The method of claim 1, wherein the device board in the step (A) comprises a thin-film transistor array substrate.

9. The method of claim 1, wherein the device board in the step (A) comprises a glass substrate or a flexible underlaying substrate.

10. A display device, comprising:
a device board comprising a thin-film transistor array substrate, a plurality of sub-pixel units disposed on the thin-film transistor array substrate, and an encapsulation layer disposed on the plurality of sub-pixel units, wherein the encapsulation layer comprises a first region and a second region;
a first light-shielding layer disposed in the first region of the encapsulation layer, wherein an inclination angle between a first light-shielding unit in the first light-shielding layer and the encapsulation layer is less than 90 degrees;
a second light-shielding layer disposed on the first light-shielding layer, wherein an inclination angle between a second light-shielding unit in the second light-shielding layer and the encapsulation layer is less than 90 degrees, and an orthogonal projection of the second light-shielding unit over the encapsulation layer covers at least one part of an orthogonal projection of the first light-shielding unit over the encapsulation layer;
a color resist layer disposed in the second region of the encapsulation layer; and
a passivation layer covering the second light-shielding layer and the color resist layer.

11. The display device of claim 10, wherein the inclination angle between the second light-shielding unit in the second light-shielding layer and the encapsulation layer is greater than or equal to the inclination angle between the first light-shielding unit in the first light-shielding layer and the encapsulation layer.

12. The display device of claim 10, wherein a thickness of the first light-shielding layer is greater than or equal to that of the second light-shielding layer.

13. The display device of claim 12, wherein a material of the second light-shielding layer comprises a fluorine-containing compound.

14. The display device of claim 13, wherein the fluorine-containing compound comprises fluororesin.

15. The display device of claim 14, wherein the fluororesin comprises one of polytetrafluoroethylene and polychlorotrifluoroethylene, or a combination thereof.

16. The display device of claim 15, wherein a plurality of color resist blocks in the color resist layer respectively correspond to the plurality of sub-pixel units in the device board.

17. The display device of claim 16, wherein a material of the color resist layer comprises one of a fluorescent material, a quantum dot material or a color filter material, or any combination thereof.

18. The display device of claim 10, wherein a material of the passivation layer comprises one of silicon oxide, silicon nitride, alumina, phenol-based resin, polypanpylene-based resin, polyimide-based resin, and acrylic resin, or any combination thereof.

* * * * *

UNITED STATES PATENT AND TRADEMARK OFFICE
CERTIFICATE OF CORRECTION

| | |
|---|---|
| PATENT NO. | : 11,393,881 B2 |
| APPLICATION NO. | : 16/958787 |
| DATED | : July 19, 2022 |
| INVENTOR(S) | : Zhengfeng Zhu |

It is certified that error appears in the above-identified patent and that said Letters Patent is hereby corrected as shown below:

On the Title Page

Item (30) should be added as follows:
Foreign Application Priority Data
March. 26, 2020 (CN)......................... 202010223053.5

Signed and Sealed this
Seventh Day of February, 2023

*Katherine Kelly Vidal*
Katherine Kelly Vidal
*Director of the United States Patent and Trademark Office*